United States Patent
Lin et al.

(10) Patent No.: US 11,726,142 B2
(45) Date of Patent: Aug. 15, 2023

(54) INTEGRATED CIRCUIT SELF-REPAIR METHOD AND INTEGRATED CIRCUIT THEREOF

(71) Applicant: REALTEK SEMICONDUCTOR CORP., Hsinchu (TW)

(72) Inventors: Yu-Pin Lin, Hsinchu (TW); Lien-Hsiang Sung, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 231 days.

(21) Appl. No.: 17/030,069

(22) Filed: Sep. 23, 2020

(65) Prior Publication Data
US 2022/0026489 A1  Jan. 27, 2022

(30) Foreign Application Priority Data
Jul. 21, 2020  (TW) ................. 109124653

(51) Int. Cl.
*G01R 31/3187*  (2006.01)
*G11C 29/44*  (2006.01)
*G11C 29/14*  (2006.01)
*G11C 13/00*  (2006.01)
*G11C 11/406*  (2006.01)
*G06F 11/14*  (2006.01)
*G06F 11/00*  (2006.01)
*G11C 16/34*  (2006.01)
*G11C 5/14*  (2006.01)

(52) U.S. Cl.
CPC .......... *G01R 31/3187* (2013.01); *G11C 29/14* (2013.01); *G11C 29/4401* (2013.01); *G06F 11/002* (2013.01); *G06F 11/1441* (2013.01); *G11C 5/148* (2013.01); *G11C 11/40618* (2013.01); *G11C 11/40622* (2013.01); *G11C 13/0033* (2013.01); *G11C 16/3418* (2013.01)

(58) Field of Classification Search
CPC .......... G11C 11/40618; G11C 16/3418; G11C 29/4401; G11C 13/0033; G11C 5/148; G11C 11/40622; G11C 29/14; G06F 11/002; G06F 11/1441; G01R 31/3187
See application file for complete search history.

(56) References Cited

U.S. PATENT DOCUMENTS

| 2005/0286309 A1* | 12/2005 | Kang ................ G11C 11/406 365/185.23 |
| 2010/0077281 A1* | 3/2010 | Bae .................... H03M 13/09 714/E11.032 |

* cited by examiner

*Primary Examiner* — April Y Blair
*Assistant Examiner* — Sazzad Hossain
(74) *Attorney, Agent, or Firm* — Birch, Stewart, Kolasch & Birch, LLP

(57) ABSTRACT

An integrated circuit self-repair method and an integrated circuit thereof are provided. The integrated circuit self-repair method includes: transmitting, by a main register, a predetermined logic state to at least three registers, and setting the at least three registers to the predetermined logic state; outputting, according to the predetermined logic state in the at least three registers, the predetermined logic state to drive a controlled circuit to perform a function; and when a minority of the at least three registers are changed to an opposite logic state due to an emergency occurring at an input power source, outputting the predetermined logic state according to the predetermined logic state of the remaining registers, and transmitting the predetermined logic state back to the register that is in the opposite logic state, to correct the opposite logic state to the predetermined logic state.

15 Claims, 8 Drawing Sheets

INTEGRATED CIRCUIT SELF-REPAIR METHOD AND INTEGRATED CIRCUIT THEREOF

CROSS-REFERENCE TO RELATED APPLICATION

This non-provisional application claims priority under 35 U.S.C. § 119(a) to Patent Application No. 109124653 in Taiwan, R.O.C. on Jul. 21, 2020, the entire contents of which are hereby incorporated by reference.

BACKGROUND

Technical Field

The invention relates to power protection technologies of an integrated circuit (IC), and in particular, to an integrated circuit self-repair method and an integrated circuit thereof.

Related Art

For an integrated circuit to operate normally, a stable power source is one of the necessary conditions. If the sudden power supply current is too large, too small, or the voltage is too high or too low, a minor effect is mainly power flicker, and then the circuit may return to normal, but in a severe case, the integrated circuit may be directly damaged and burned, and the effect will be huge. In the existing power management technology, a power protection circuit, for example, a pulse width modulation circuit, a linear regulator, and the like, is usually designed outside the integrated circuit to provide the integrated circuit with a complete power protection function. Therefore, for the entire system, the existing circuit protection design provides protection from the outside of the integrated circuit, and cannot directly provide protection and repair of the power setting from the inside of the integrated circuit.

SUMMARY

In view of this, the invention proposes an integrated circuit self-repair method, including: transmitting, by a main register, a predetermined logic state to at least three registers, and setting the at least three registers to the predetermined logic state; outputting, according to the predetermined logic state in the at least three registers, the predetermined logic state to drive a controlled circuit to perform a function; and when a minority of the at least three registers are changed to an opposite logic state due to an emergency occurring at an input power source, outputting the predetermined logic state according to the predetermined logic state of the remaining registers, and transmitting the predetermined logic state back to the register that is in the opposite logic state, to correct the opposite logic state to the predetermined logic state.

The invention further proposes an integrated circuit, including a setting circuit, at least one main register, at least one protection circuit, and a controlled circuit. The setting circuit generates a transmission protocol with at least one predetermined logic state and transmits the transmission protocol to the main register, and the main register is electrically connected to the setting circuit, to receive the predetermined logic state according to the transmission protocol. The protection circuit is electrically connected to the main register and the setting circuit, the protection circuit includes at least three registers, and the main register sets the at least three registers to the predetermined logic state, so that the protection circuit outputs the predetermined logic state. The controlled circuit performs a function according to the predetermined logic state. When a minority of the at least three registers are changed to an opposite logic state due to an emergency occurring at an input power source, the protection circuit outputs the predetermined logic state according to the predetermined logic state of the remaining registers, and transmits the predetermined logic state back to the register that is in the opposite logic state, to correct the opposite logic state to the predetermined logic state.

According to some embodiments, when the emergency occurs at the input power source, the predetermined logic state is output according to the predetermined logic state of a majority of the remaining registers.

According to some embodiments, when the predetermined logic state is 1, the opposite logic state is 0.

According to some embodiments, the main register transmits a multi-bit logic state to an encoding unit, the encoding unit converts the multi-bit logic state into a plurality of predetermined logic states and transmits the predetermined logic states to the corresponding registers, so that the registers respectively output the predetermined logic states to a decoding unit. The decoding unit combines the predetermined logic states into the multi-bit logic state to drive the controlled circuit to perform the function.

According to some embodiments, the decoding unit may further transmit the multi-bit logic state to the main register, and then transmits the multi-bit logic state to the controlled circuit through the main register.

According to some embodiments, when the emergency occurs at the input power source, and the decoding unit receives the predetermined logic state and the opposite logic state, the decoding unit performs self-correction according to the predetermined logic state of the remaining registers and encoding rules of the multi-bit logic state, to output the correct multi-bit logic state, and transmits the correct predetermined logic state back to the register that is in the opposite logic state, to correct the opposite logic state to the predetermined logic state.

According to some embodiments, when the foregoing multi-bit logic state is a double-bit logic state, a double-one-hot encoding rule is adopted, 0 being encoded into 0011, and 1 being encoded into 1100.

According to some embodiments, the multi-bit logic state adopts a multi-one-hot encoding rule, and four sets of codes of the multi-bit logic state include 00_00_00_11, 00_00_11_00, 00_11_00_00, and 11_00_00_00.

In conclusion, according to the invention, the circuit is directly designed inside the integrated circuit, so that the integrated circuit has the functions of power protection and repair inside, to maintain the power supply of the integrated circuit itself in the best state, thereby preventing the integrated circuit from stopping operation or being damaged due to the power emergency. Furthermore, the invention may further be combined with the existing external power protection technology to achieve a complete power protection function, so that the integrated circuit maintains the best performance.

DETAILED DESCRIPTION

The integrated circuit self-repair method provided in the invention is used inside an integrated circuit, and the technology of the invention is used to make the integrated circuit achieve the purpose of self-protection and self-repair, so as to maintain power supply of the integrated circuit itself in the best state.

Figure 1:
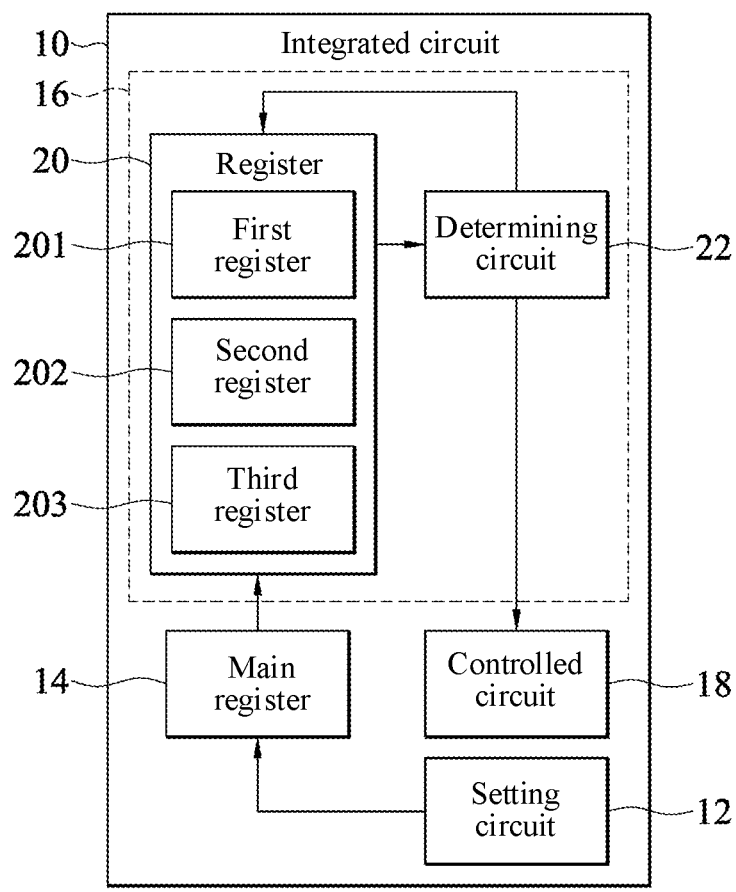
FIG. 1 is a schematic block diagram of an integrated circuit according to an embodiment of the invention.

FIG. 1 is a schematic block diagram of an integrated circuit according to an embodiment of the invention. Referring to FIG. 1, an integrated circuit 10 includes a setting circuit 12, a main register 14, a protection circuit 16, and a controlled circuit 18. The setting circuit 12 is electrically connected to the main register 14 and the protection circuit 16, and the protection circuit 16 is electrically connected to the controlled circuit 18. In one embodiment, the protection circuit 16 further includes at least three registers 20 (which are referred to as a first register 201, a second register 202, and a third register 203 below) and a determining circuit 22. The first register 201, the second register 202, and the third register 203 are electrically connected to the main register 14 and the determining circuit 22, and the determining circuit 22 is electrically connected to the controlled circuit 18.

Figure 2:
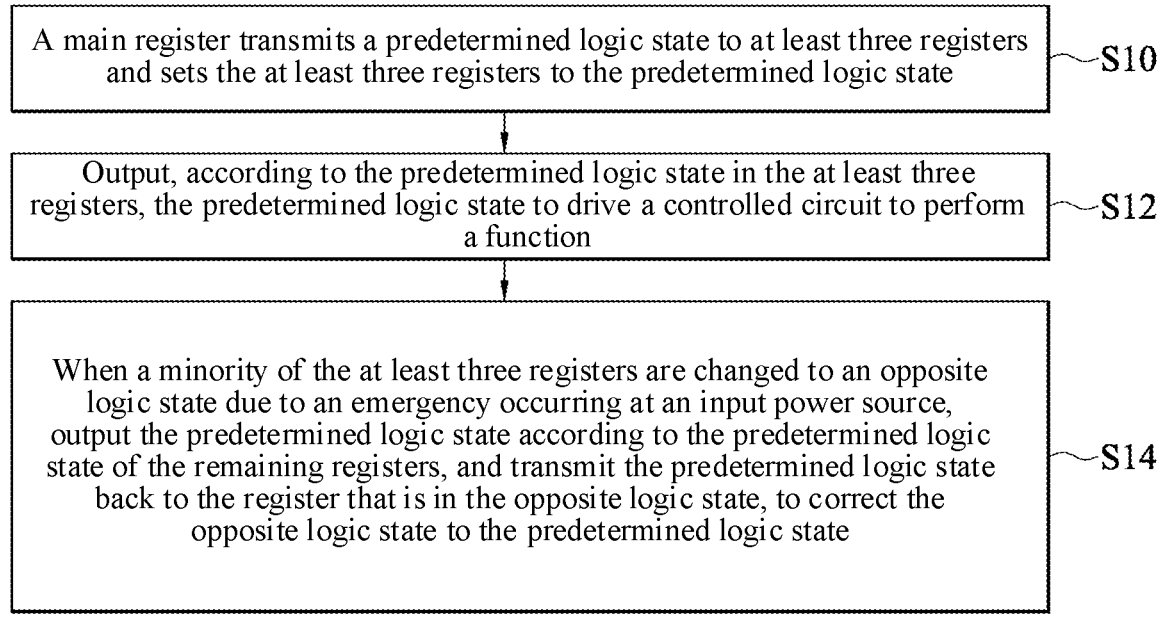
FIG. 2 is a schematic flowchart of an integrated circuit self-repair method according to an embodiment of the invention.

FIG. 2 is a schematic flowchart of an integrated circuit self-repair method according to an embodiment of the invention. Referring to FIG. 1 and FIG. 2 together, the self-repair method is performed in the integrated circuit 10, and the self-repair method of the integrated circuit includes steps S10 to S14. As shown in step S10, the main register 14 transmits a predetermined logic state to at least three registers 20: the first register 201, the second register 202, and the third register 203, and sets the at least three registers 20 to the predetermined logic state. As shown in step S12, the determining circuit 22 outputs, according to predetermined logic states in the first register 201, the second register 202, and the third register 203, the predetermined logic state to the controlled circuit 18 to drive the controlled circuit 18 to perform a function. As shown in step S14, when a minority of the first register 201, the second register 202, and the third register 203 are changed to an opposite logic state due to an emergency occurring at an input power source, for example, when the second register 202 is changed to the opposite logic state, the determining circuit 22 still outputs the predetermined logic state to the controlled circuit 18 according to the predetermined logic state of a rest of the first register 201 and the third register 203, and transmits the correct predetermined logic state back to the second register 202 in the opposite logic state, to correct the opposite logic state of the second register 202 to the predetermined logic state. Although the second register 202 is disabled due to the emergency, the correct logic state may still be determined through most of other first registers 201 and third registers 203, and the second register 202 in an incorrect state is repaired to return to the correct predetermined logic state.

In one embodiment, the predetermined logic state is generated by a setting circuit 12, the setting circuit 12 transmits a transmission protocol with the predetermined logic state to the main register 14, so that the main register 14 may respectively set the first register 201, the second register 202, and the third register 203 to the predetermined logic state based on the transmission protocol.

In one embodiment, when the predetermined logic state is 1, the opposite logic state is 0. Referring to FIG. 1, at the beginning, the setting circuit 12 transmits the predetermined logic state of 1 to the main register 14, and the main register 14 then sets the logic states of the first register 201, the second register 202, and the third register 203 to 1. In this case, the logic states of the first register 201, the second register 202, and the third register 203 are all 1, the determining circuit 22 determines that there is the largest number of 1 (predetermined logic states), and therefore 1 is output to the controlled circuit 18, so that the controlled circuit 18 performs a specific function. When an emergency occurs at the input power supply (for example, the power supply flashes once), the predetermined logic state of the second register 202 is changed from 1 to the opposite logic state 0. However, because most of the first register 201 and the third register 203 are maintained in the state of 1 (the predetermined logic state), the determining circuit 22 still determines that the number of 1 is the largest and outputs 1 to the controlled circuit 18, so that the controlled circuit 18 may still continue to perform the function. In addition, the determining circuit 22 may transmit 1 back to the first register 201, the second register 202, and the third register 203, so that the second register 202 in the incorrect state is corrected back to the correct 1 (the predetermined logic state).

Figure 3:
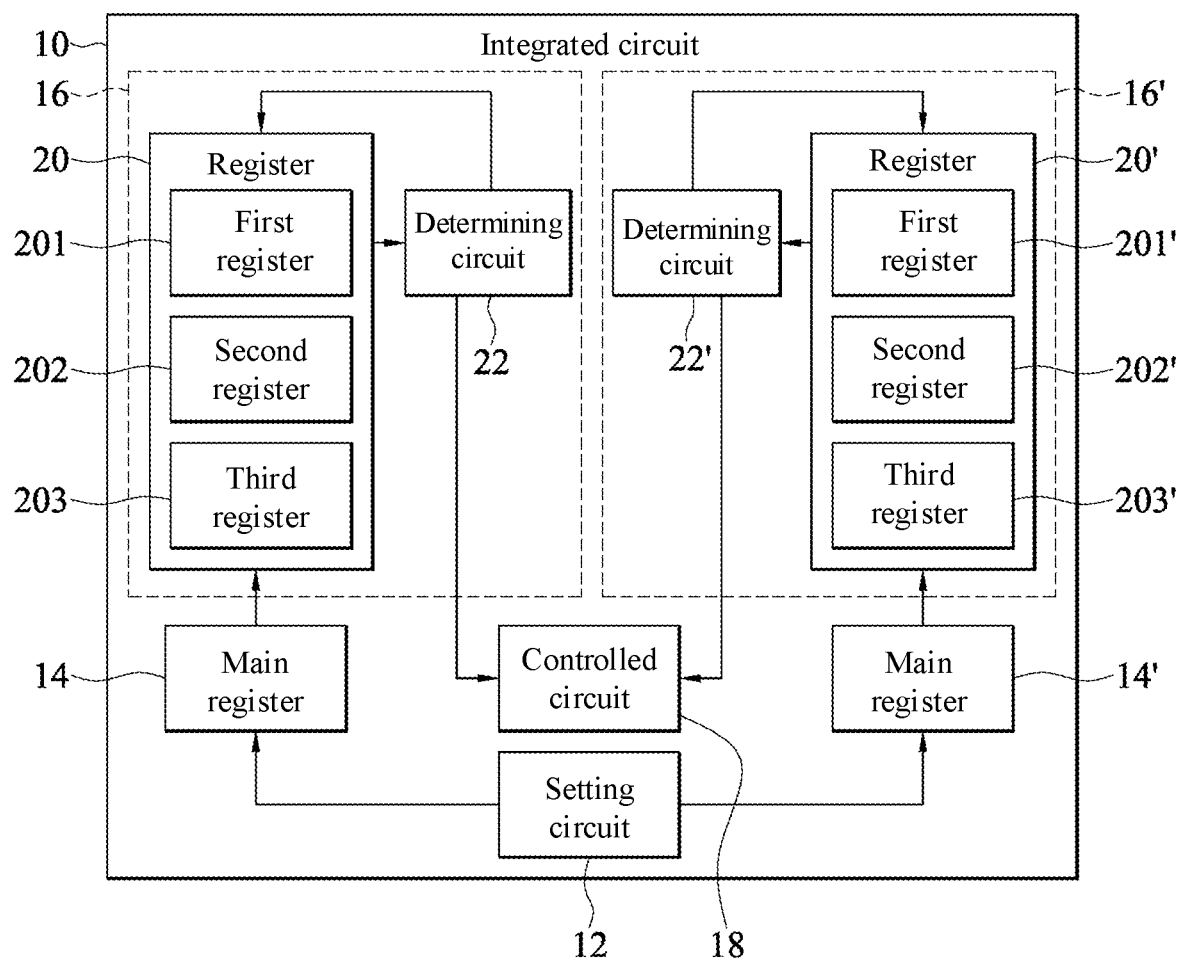
FIG. 3 is a schematic block diagram of an integrated circuit according to another embodiment of the invention.

In the integrated circuit 10, more than two groups of main registers 14 and protection circuits 16 may be further designed to control the controlled circuit 18. Herein, two groups are used as an example, but are not limited thereto. As shown in FIG. 3, the integrated circuit 10 includes a setting circuit 12, two main registers 14 and 14', two protection circuits 16 and 16', and a controlled circuit 18. The setting circuit 12 is electrically connected to the two main registers 14 and 14' and the two protection circuits 16 and 16', the main register 14 is electrically connected to the protection circuit 16, the main register 14' is electrically connected to the protection circuit 16', and the two protection circuits 16 and 16' are respectively electrically connected to the controlled circuit 18. The protection circuit 16 includes at least three registers 20 (a first register 201, a second register 202, and a third register 203) and a determining circuit 22. The first register 201, the second register 202, and the third register 203 are electrically connected to the main register 14 and the determining circuit 22, and the determining circuit 22 is electrically connected to the controlled circuit 18. The protection circuit 16' also includes at least three registers 20' (a first register 201', a second register 202', and a third register 203') and a determining circuit 22'. The first register 201', the second register 202', and the third register 203' are electrically connected to the main register 14' and the determining circuit 22', and the determining circuit 22' is electrically connected to the controlled circuit 18. In the integrated circuit 10, the setting circuit 12 transmits a transmission protocol with the predetermined logic state to the main registers 14 and 14', so that the main registers 14 and 14' may respectively set the first registers 201 and 201', the second registers 202 and 202', and the third registers 203 and 203' to the predetermined logic state based on the transmission protocol. The determining circuits 22 and 22' respectively output most of the predetermined logic states in the respective registers 20 and 20' to the controlled circuit 18 to drive the controlled circuit 18 to perform a function. When a minority of the second registers 202 of the first registers 201, 201', the second registers 202, 202', and the third registers 203, 203' are changed to an opposite logic state due to an emergency occurring at an input power source, the determining circuit 22, 22' still respectively output the predetermined logic states to the controlled circuit 18 according to the predetermined logic state of the rest of the first registers 201, 201', the second register 202', and the third registers 203, 203', and transmits the correct predetermined logic state back to the second register 202' in the opposite logic state, to correct the opposite logic state of the second register 202' to the predetermined logic state. In the integrated circuit 10, although there are two groups of main registers 14, 14' and protection circuits 16, 16', the connection relationship therebetween and the operation are the same as that in the previous embodiments, and a difference lies in the number of bits, so as to provide more bits to achieve the effect of protecting the setting of the integrated circuit 10.

Figure 4:
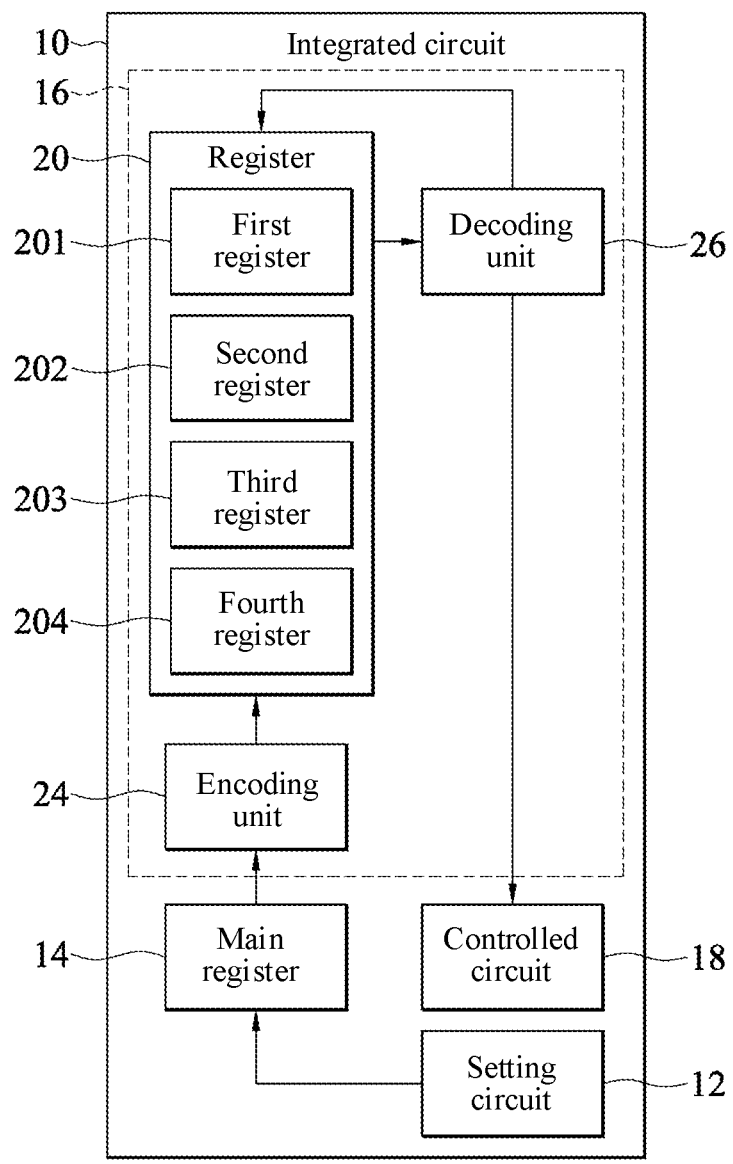
FIG. 4 is a schematic block diagram of an integrated circuit according to yet another embodiment of the invention.

In one embodiment, referring to FIG. 4, the integrated circuit 10 includes a setting circuit 12, a main register 14, a protection circuit 16, and a controlled circuit 18. The setting circuit 12 is electrically connected to the main register 14 and the protection circuit 16, and the protection circuit 16 is electrically connected to the controlled circuit 18. The protection circuit 16 includes four registers 20 (which are referred to as a first register 201, a second register 202, a third register 203, and a fourth register 204 below), an encoding unit 24, and a decoding unit 26. The encoding unit 24 is electrically connected to the main register 14, the first register 201, the second register 202, the third register 203, and the fourth register 204, and the decoding unit 26 is electrically connected to the first register 201, the second register 202, the third register 203, the fourth register 204, and the controlled circuit 18. The setting circuit 12 generates a transmission protocol with a multi-bit logic state (including a plurality of predetermined logic states) and transmits the transmission protocol to the main register 14, and the main register 14 transmits the multi-bit logic state to the encoding unit 24. The encoding unit 24 converts the multi-bit logic state into a plurality of predetermined logic states, transmits the predetermined logic states to the corresponding first register 201, second register 202, third register 203, and fourth register 204, and sets states thereof to a predetermined logic state. The first register 201, the second register 202, the third register 203, and the fourth register 204 respectively output respective predetermined logic states to the decoding unit 26, so that the decoding unit 26 combines these predetermined logic states into the multi-bit logic state and transmits the multi-bit logic state to the controlled circuit 18 to drive the controlled circuit 18 to perform the function thereof. When a minority of the first register 201, the second register 202, the third register 203, and the fourth register 204 are changed to an opposite logic state due to an emergency occurring at an input power source, for example, when the second register 202 is changed to the opposite logic state, the decoding unit 26 performs self-correction according to the predetermined logic state of the rest of the first register 201, the third register 203, and the fourth register 204 and encoding rules of the multi-bit logic state, to output the correct multi-bit logic state, and transmits the correct predetermined logic state back to the second register 202 in the opposite logic state, to correct the opposite logic state of the second register to the correct predetermined logic state.

In one embodiment, when the multi-bit logic state is a double-bit logic state, a double-one-hot encoding rule may be adopted in the invention, and therefore there are four bits, 0 being encoded into 4'b0011, and 1 being encoded into 4'b1100. Referring to FIG. 4, when the multi-bit logic state is 4'b0011, the predetermined logic states of the first register 201, the second register 202, the third register 203, and the fourth register 204 are 0, 0, 1, and 1, respectively. In case of an emergency, a certain state of 0 (a predetermined logic state) becomes 1 (an opposite logic state), for example, 4'b1011 or 4'b0111. Because bits [1:0] are all 1, according to the encoding rule of the multi-bit logic state, the decoding unit 26 may obtain the correct value of 4'b0011, then can output the correct multi-bit logic state to the controlled circuit 18 and transmit the correct predetermined logic state back to the first register 201, the second register 202, the third register 203, and the fourth register 204, so as to correct the incorrect state of 1 (the opposite logic state) to 0 (the predetermined logic state) by itself. In case of an emergency, a certain state of 1 (a predetermined logic state) becomes 0 (an opposite logic state), for example, 4'b0010 or 4'b0001. Because bits [1:0] include only one state of 1, according to the encoding rule of the multi-bit logic state, the decoding unit 26 may obtain the correct value of 4'b0011, then can output the correct multi-bit logic state to the controlled circuit 18 and transmit the correct predetermined logic state back to the first register 201, the second register 202, the third register 203, and the fourth register 204, so as to correct the incorrect state of 0 (the opposite logic state) to 1 (the predetermined logic state) by itself.

Similarly, when the multi-bit logic state is 4'b1100, the predetermined logic states of the first register 201, the second register 202, the third register 203, and the fourth register 204 are 1, 1, 0, and 0, respectively. In case of an emergency, a certain state of 0 (a predetermined logic state) becomes 1 (an opposite logic state), for example, 4'b1110 or 4'b1101. Because bits [3:2] are all 1, and according to the encoding rule of the multi-bit logic state, the decoding unit 26 may obtain the correct value of 4'b1100, then can output the correct multi-bit logic state to the controlled circuit 18 and transmit the correct predetermined logic state back to the first register 201, the second register 202, the third register 203, and the fourth register 204, so as to correct 1 (the opposite logic state) to 0 (the predetermined logic state) by itself. In case of an emergency, a certain state of 1 (a predetermined logic state) becomes 0 (an opposite logic state), for example, 4'b1000 or 4'b0100. Because bits [3:2] include only one state of 1, according to the encoding rule of the multi-bit logic state, the decoding unit 26 may obtain the correct value of 4'b1100, then can output the correct multi-bit logic state to the controlled circuit 18 and transmit the correct predetermined logic state back to the first register 201, the second register 202, the third register 203, and the fourth register 204, so as to correct 0 (the opposite logic state) to 1 (the predetermined logic state) by itself.

Figure 5:
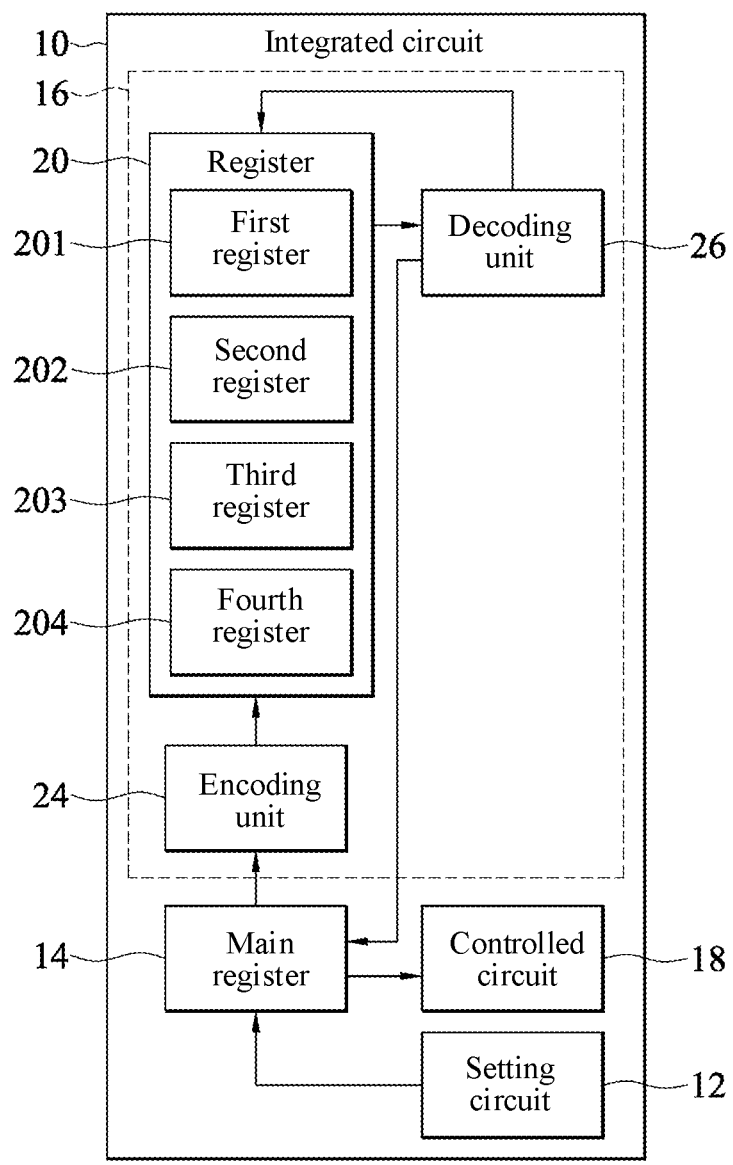
FIG. 5 is a schematic block diagram of an integrated circuit according to still another embodiment of the invention.

In another embodiment, the decoding unit 26 is not directly electrically connected to the controlled circuit 18 but is electrically connected to the main register 14. As shown in FIG. 5, since the decoding unit 26 is electrically connected to the main register 14, the decoding unit 26 first transmits the multi-bit logic state to the main register 14 and then transmits the multi-bit logic state to the controlled circuit 18 through the main register 14. Except for the different connection relationships for the decoding unit 26, other detailed connection relationships and operations are the same as that of the embodiment shown in FIG. 4, and therefore reference may be made to the previous description, which are not described herein again.

Figure 6:
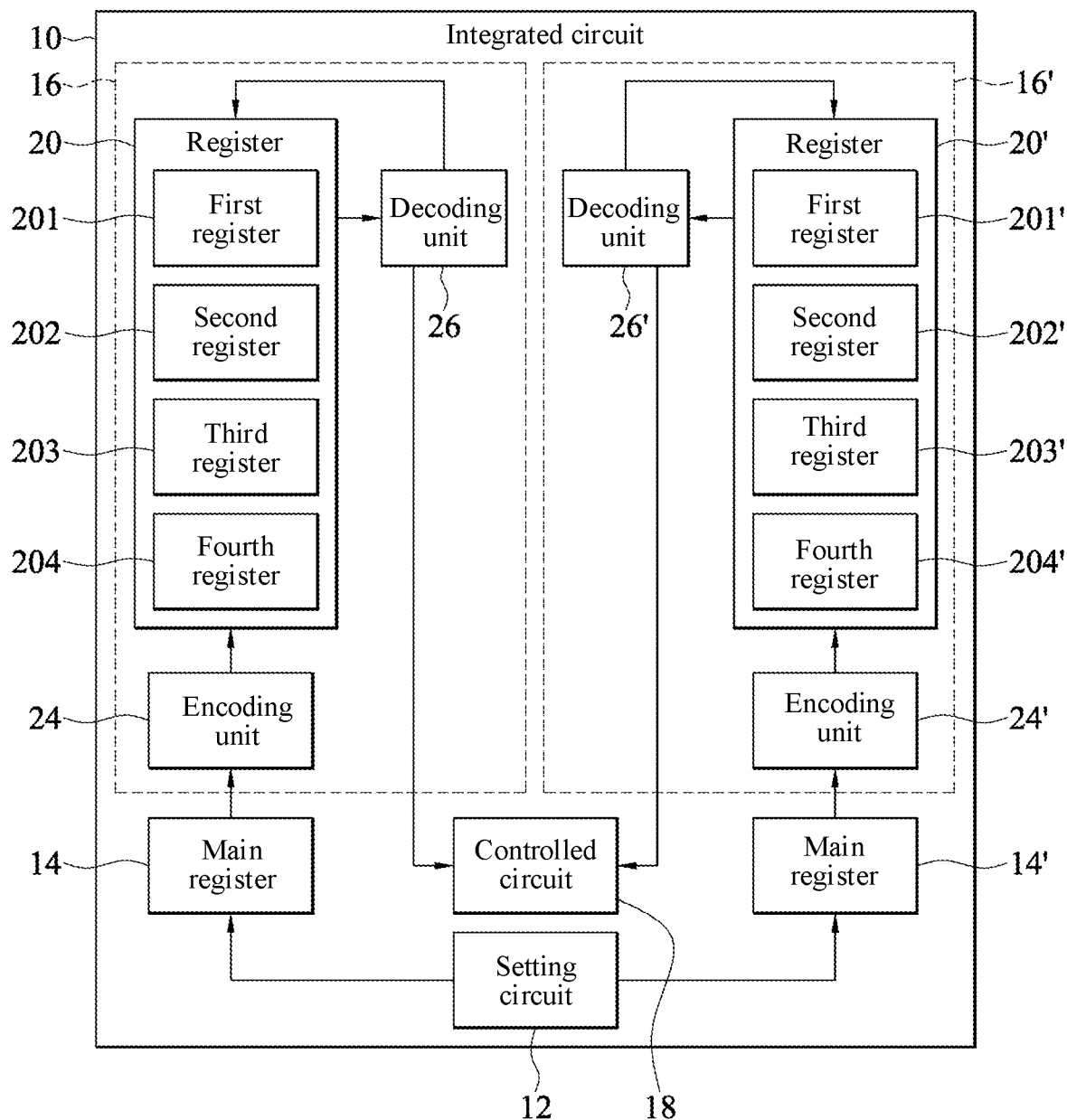
FIG. 6 is a schematic block diagram of an integrated circuit according to still another embodiment of the invention.

In one embodiment, the integrated circuit 10 shown in FIG. 4 may also be designed to have more than two groups of main registers 14 and protection circuits 16 to control the controlled circuit 18. Herein, two groups are used as an example, but are not limited thereto. Referring to FIG. 6, in addition to the original setting circuit 12, the main register 14, the protection circuit 16, and the controlled circuit 18, the integrated circuit 10 further includes a main register 14' and a protection circuit 16'. The main register 14' is electrically connected to the setting circuit 12 and the protection circuit 16'. The protection circuit 16' is electrically connected to the controlled circuit 18 and includes four registers 20', an encoding unit 24', and a decoding unit 26'. The four registers 20' include a first register 201', a second register 202', a third register 203', and a fourth register 204'. The encoding unit 24' is electrically connected to the main register 14', the first register 201', the second register 202', the third register 203', and the fourth register 204', and the decoding unit 26' is electrically connected to the first register 201', the second register 202', the third register 203', the fourth register 204', and the controlled circuit 18. Therefore, the integrated circuit 10 may protect the setting through the two groups of main registers 14, 14' and the protection circuits 16, 16', and may be repaired by itself in case of an emergency at the input power supply.

Figure 7:
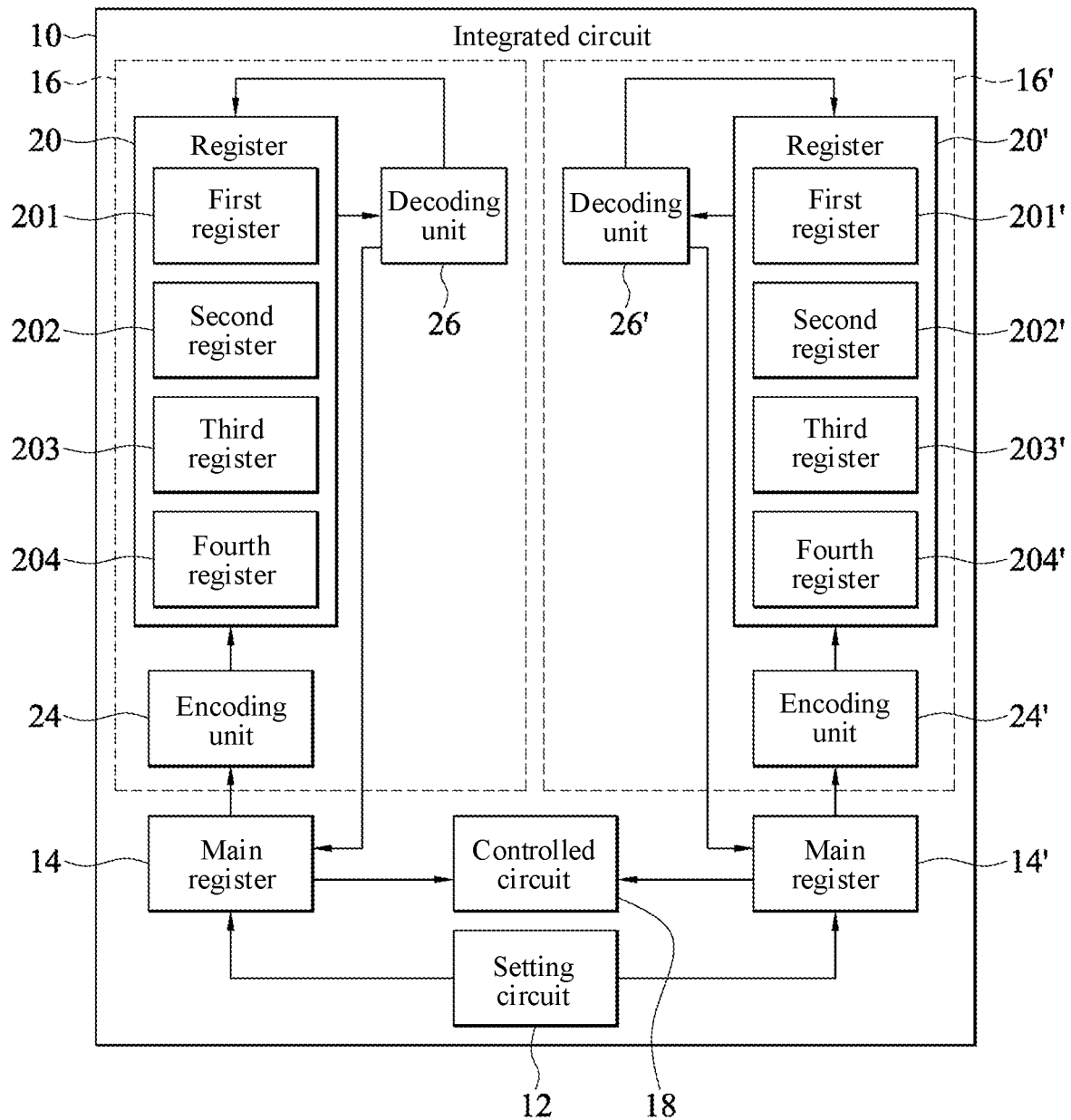
FIG. 7 is a schematic block diagram of an integrated circuit according to still another embodiment of the invention.

In one embodiment, the integrated circuit 10 shown in FIG. 5 may also be designed to have more than two groups of main registers 14 and protection circuits 16 to control the controlled circuit 18. Herein, two groups are used as an example, but are not limited thereto. Referring to FIG. 7, the integrated circuit 10 includes a setting circuit 12, two main registers 14, 14', two protection circuits 16, 16', and a controlled circuit 18. In addition to the original setting circuit 12, the main register 14, the protection circuit 16, and the controlled circuit 18, the integrated circuit 10 further includes a main register 14' and a protection circuit 16'. The main register 14' is electrically connected to the setting circuit 12, the protection circuit 16', and the controlled circuit 18, and the protection circuit 16' includes four registers 20', an encoding unit 24', and a decoding unit 26'. The four registers 20' include a first register 201', a second register 202', a third register 203', and a fourth register 204'. The encoding unit 24' is electrically connected to the main register 14', the first register 201', the second register 202', the third register 203', and the fourth register 204', and the decoding unit 26' is electrically connected to the first register 201', the second register 202', the third register 203', the fourth register 204', and the main register 14'. The decoding units 26, 26' are respectively electrically connected to the main registers 14, 14', so that the decoding units 26, 26' may transmit the multi-bit logic state to the main registers 14, 14', and then transmit the multi-bit logic state to the controlled circuit 18 through the main registers 14, 14'. Therefore, the integrated circuit 10 may protect the setting through the two groups of main registers 14, 14' and the protection circuits 16, 16', and may be repaired by itself in case of an emergency at the input power supply.

Figure 8:
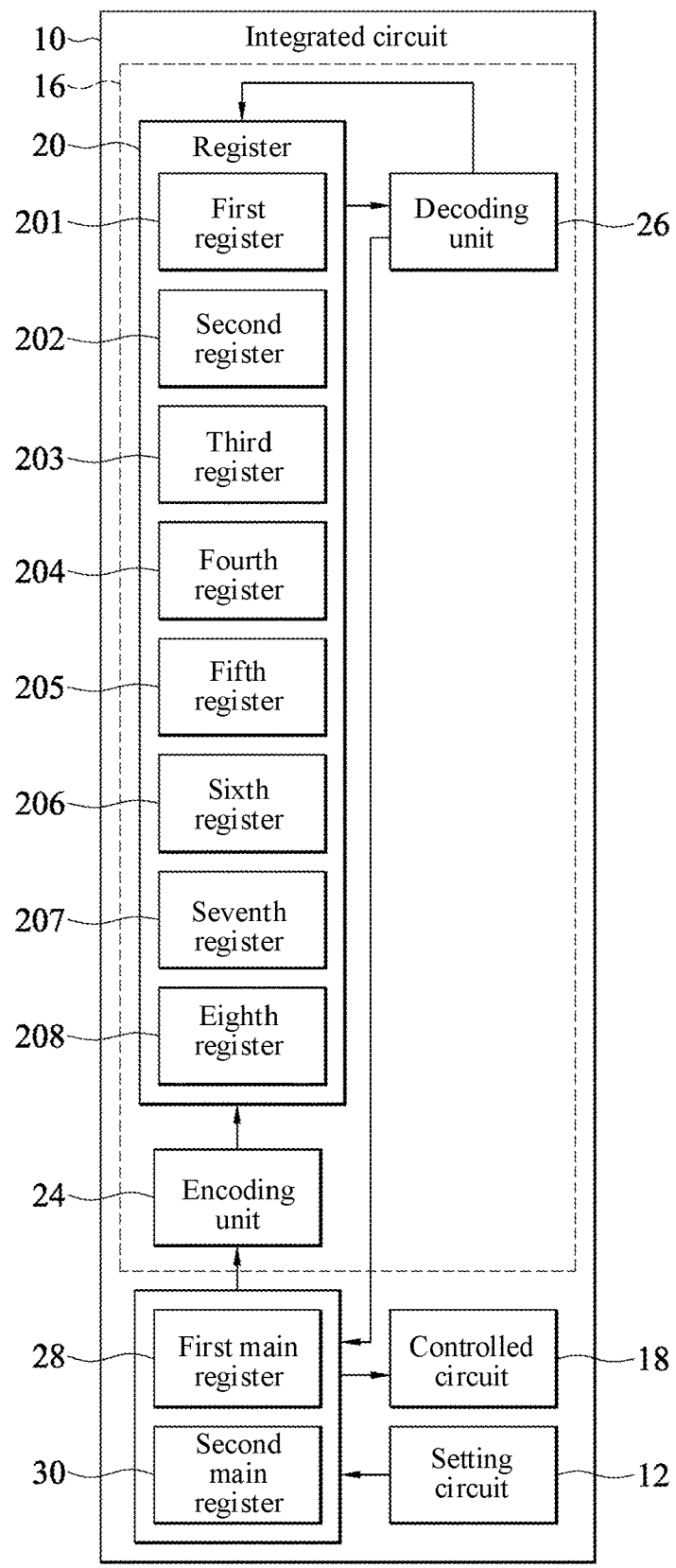
FIG. 8 is a schematic block diagram of an integrated circuit according to still another embodiment of the invention.

In one embodiment, referring to FIG. 8, the integrated circuit 10 includes a setting circuit 12, a first main register 28, a second main register 30, a protection circuit 16, and a controlled circuit 18. The first main register 28 and the second main register 30 are electrically connected to the setting circuit 12, the protection circuit 16, and the controlled circuit 18. Furthermore, the protection circuit 16 includes eight registers 20 (which are referred to as a first register 201, a second register 202, a third register 203, a fourth register 204, a fifth register 205, a sixth register 206, a seventh register 207, and an eighth register 208), an encoding unit 24, and a decoding unit 26. The encoding unit 24 is electrically connected to the first main register 28, the second main register 30, and the first register 201 to the eighth register 208, and the decoding unit 26 is electrically connected to the first register 201 to the eighth register 208, the first main register 28, and the second main register 30. The setting circuit 12 generates a transmission protocol with a multi-bit logic state (including a plurality of predetermined logic states) and transmits the transmission protocol to the first main register 28 and the second main register 30, and transmits the multi-bit logic state to the encoding unit 24. The encoding unit 24 converts the multi-bit logic state into a plurality of predetermined logic states, transmits the predetermined logic states to the corresponding first register 201 to eighth register 208, and sets states thereof to a predetermined logic state. The first register 201 to the eighth register 208 respectively output respective predetermined logic states to the decoding unit 26, so that the decoding unit 26 combines these predetermined logic states into the multi-bit logic state and transmits the multi-bit logic state to the controlled circuit 18 through the first main register 28 and the second main register 30 to drive the controlled circuit 18 to perform the function thereof. When a minority of the first register 201 to the eighth register 208 are changed to an opposite logic state due to an emergency occurring at an input power source, for example, when the eighth register 208 is changed to the opposite logic state, the decoding unit 26 performs self-correction according to the predetermined logic state of the rest of the first register 201 to the seventh register 207 and encoding rules of the multi-bit logic state, to output the correct multi-bit logic state, and transmits the correct predetermined logic state back to the eighth register 208 in the opposite logic state, to correct the opposite logic state of the eighth register to the correct predetermined logic state.

In one embodiment, the multi-bit logic state adopts the multi-one-hot encoding rule, and is combined with the first main register 28 and the second main register 30 to form four sets of codes of the multi-bit logic state, that is, {reg_b,reg_a}=2'b00 is encoded into 8'b00_00_00_11; {reg_b,reg_a}=2'b01 is encoded into 8'b00_00_11_00; {reg_b,reg_a}=2'b10 is encoded into 8'b00_11_00_00; and {reg_b,reg_a}=2'b11 is encoded into 8'b11_00_00_00. 8'b00_00_00_11 is used as an example. In case of an emergency, a certain state of 0 (a predetermined logic state) becomes 1 (an opposite logic state), for example, 8'b00_10_00_11. Because bits [1:0] are all 1, according to the encoding rule of the multi-bit logic state, the decoding unit 26 may obtain the correct value of 8'b00_00_00_11, then can output the correct multi-bit logic state 8'b00_00_00_11 to the controlled circuit 18 through the first main register 28 and the second main register 30, and transmit the correct predetermined logic state back to the first register 201 to the eighth register 208, so as to correct the incorrect state of 1 (the opposite logic state) to the correct state of 0 (the predetermined logic state) by itself in the eighth register 208, and so on. As a result, the purpose of self-protection and self-repair can be achieved by using the function of the protection circuit.

Therefore, according to the invention, the circuit is directly designed inside the integrated circuit, so that the integrated circuit has the functions of power protection and repair inside, to maintain the power supply of the integrated circuit itself in the best state, thereby preventing the integrated circuit from stopping operation or being damaged due to the power emergency. Furthermore, the invention may further be combined with the existing external power protection technology to achieve a complete power protection function, so that the integrated circuit maintains the best performance.

Although the invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. An integrated circuit self-repair method, comprising:
   transmitting, by a main register, a predetermined logic state to at least three registers, and setting the at least three registers to the predetermined logic state;
   outputting, according to the predetermined logic state in the at least three registers, the predetermined logic state to drive a controlled circuit to perform a function; and
   when a minority of the at least three registers are changed to an opposite logic state due to an emergency occurring at an input power source, outputting the predetermined logic state according to the predetermined logic state of the remaining registers, and transmitting the predetermined logic state back to the register that is in the opposite logic state, to correct the opposite logic state to the predetermined logic state;
   wherein the main register transmits a multi-bit logic state to an encoding unit, the encoding unit converts the multi-bit logic state into a plurality of predetermined logic states and transmits the predetermined logic states to the corresponding registers, so that the registers output the predetermined logic states to a decoding unit to combine the predetermined logic states into the multi-bit logic state to drive the controlled circuit to perform the function.

2. The integrated circuit self-repair method according to claim 1, wherein the predetermined logic state is generated by a setting circuit, the setting circuit transmits a transmission protocol with the predetermined logic state to the main register, so that the at least three registers are set to the predetermined logic state.

3. The integrated circuit self-repair method according to claim 1, wherein when an emergency occurs at the input power source, the predetermined logic state is output according to the predetermined logic state of a majority of the remaining registers.

4. The integrated circuit self-repair method according to claim 3, wherein when the predetermined logic state is 1, the opposite logic state is 0.

5. The integrated circuit self-repair method according to claim 1, wherein the decoding unit further transmits the multi-bit logic state to the main register, and then the main register transmits the multi-bit logic state to the controlled circuit.

6. The integrated circuit self-repair method according to claim 1, wherein when an emergency occurs at the input power source, and the decoding unit receives the predetermined logic states and the opposite logic state, the decoding unit performs self-correction according to the predetermined logic state of the remaining registers and encoding rules of the multi-bit logic state, to output the correct multi-bit logic state, and transmits the correct predetermined logic state back to the register that is in the opposite logic state, to correct the opposite logic state to the predetermined logic state.

7. The integrated circuit self-repair method according to claim 1, wherein when the multi-bit logic state is a double-bit logic state, a double-one-hot encoding rule is adopted, 0 being encoded into 0011, and 1 being encoded into 1100.

8. The integrated circuit self-repair method according to claim 1, wherein the multi-bit logic state adopts a multi-one-hot encoding rule, four sets of codes of the multi-bit logic state comprising 00_00_00_11, 00_00_11_00, 00_11_00_00, and 11_00_00_00.

9. An integrated circuit, comprising:
   a setting circuit configured to generate a transmission protocol that has at least one predetermined logic state;
   at least one main register electrically connected to the setting circuit, to receive the predetermined logic state according to the transmission protocol;
   at least one protection circuit electrically connected to the main register and the setting circuit, the protection circuit comprises at least three registers, the main register sets the at least three registers to the predetermined logic state, and the protection circuit outputs the predetermined logic state; and
   a controlled circuit configured to perform a function according to the predetermined logic state, wherein
   when a minority of the at least three registers are changed to an opposite logic state due to an emergency occurring at an input power source, the protection circuit outputs the predetermined logic state according to the predetermined logic state of the remaining registers, and transmits the predetermined logic state back to the register that is in the opposite logic state, to correct the opposite logic state to the predetermined logic state;
   wherein the protection circuit further comprises an encoding unit and a decoding unit, the encoding unit is electrically connected to the main register and the at least three registers, and the decoding unit is electrically connected to the at least three registers, and the setting circuit generates a multi-bit logic state comprising a plurality of predetermined logic states, the main register transmits the multi-bit logic state to the encoding unit, and the encoding unit converts the multi-bit logic state into the plurality of predetermined logic states and transmits the predetermined logic states to the corresponding registers, so that the registers output the predetermined logic states to the decoding unit, and the decoding unit combines the predetermined logic states into the multi- bit logic state to drive the controlled circuit to perform the function.

10. The integrated circuit according to claim 9, wherein the protection circuit further comprises a determining circuit electrically connected to the at least three registers and the controlled circuit, the determining circuit is capable of selecting a predetermined logic state of a majority of the registers for output, and transmits the predetermined logic state back to the register that is in the opposite logic state, so as to correct the opposite logic state to the predetermined logic state of the majority.

11. The integrated circuit according to claim 10, wherein when the predetermined logic state is 1, the opposite logic state is 0.

12. The integrated circuit according to claim 10, wherein the decoding unit is further electrically connected to the main register, the decoding unit transmits the multi-bit logic state to the main register, and then the main register transmits the multi-bit logic state to the controlled circuit.

13. The integrated circuit according to claim 9, wherein when an emergency occurs at the input power source, and the decoding unit receives the predetermined logic states and the opposite logic state, the decoding unit performs self-correction according to the predetermined logic state of the remaining registers and encoding rules of the multi-bit logic state, to output the correct multi-bit logic state, and transmits the correct predetermined logic state back to the register that is in the opposite logic state, to correct the opposite logic state to the predetermined logic state.

14. The integrated circuit according to claim 10, wherein when the multi-bit logic state is a double-bit logic state, a double-one-hot encoding rule is adopted, 0 being encoded into 0011, and 1 being encoded into 1100.

15. The integrated circuit according to claim 10, wherein the multi-bit logic state adopts a multi-one-hot encoding rule, four sets of codes of the multi-bit logic state comprising 00_00_00_11, 00_00_11_00, 00_11_00_00, and 11_00_00_00.

* * * * *